United States Patent [19]

Da Lin et al.

[11] Patent Number: 5,079,428
[45] Date of Patent: Jan. 7, 1992

[54] ELECTRON MICROSCOPE WITH AN ASYMMETRICAL IMMERSION LENS

[75] Inventors: Paul S. Da Lin, Middletown, N.J.; Zhifeng Shao, Charlottesville, Va.

[73] Assignees: Bell Communications Research, Inc., Livingston, N.J.; Arch Development Corp., Chicago, Ill.

[21] Appl. No.: 401,629

[22] Filed: Aug. 31, 1989

[51] Int. Cl.$^5$ .............................................. H01J 3/20
[52] U.S. Cl. ..................... 250/396 ML; 250/396 R; 250/398
[58] Field of Search ................ 250/396 ML, 310, 306, 250/311, 396 R, 397, 398

[56] References Cited

U.S. PATENT DOCUMENTS

| | | | |
|---|---|---|---|
| 2,418,432 | 4/1947 | Smith | 250/49.5 |
| 2,819,403 | 1/1958 | Reisner | 250/49.5 |
| 3,560,739 | 2/1971 | Wolff | 250/49.5 |
| 3,707,628 | 12/1972 | Bassett et al. | 250/49.5 |
| 3,924,126 | 12/1975 | Anderson et al. | 250/311 |
| 4,306,149 | 12/1981 | Le Poole et al. | 250/396 ML |
| 4,426,577 | 1/1984 | Koike et al. | 250/310 |
| 4,437,009 | 3/1984 | Yamazaki | 250/396 ML |
| 4,450,355 | 5/1984 | Marien et al. | 250/310 |
| 4,633,085 | 12/1986 | Tomita et al. | 250/311 |
| 4,639,597 | 1/1987 | Shiokawa | 250/305 |
| 4,769,543 | 9/1988 | Plies | 250/396 ML |
| 4,803,356 | 2/1989 | Kumahora et al. | 250/306 |
| 4,806,767 | 2/1989 | Kurozoe et al. | 250/396 ML |

FOREIGN PATENT DOCUMENTS 60-258836A 12/1985 Japan.
62-229643A 10/1987 Japan.

OTHER PUBLICATIONS

J. B. Pawley, "Low Voltage Scanning Electron Microscopy," *EMSA Bulletin*, 1988, vol. 18, pp. 61-64.
Z. Shao, "New Lens for a Low-Voltage Scanning Electron Microscope," *Review of Scientific Instruments*, 1988, vol. 59, pp. 1985-1989.
M. Szilagyi, "Electron and Ion Optics," Plenum Press, New York, 1988, pp., 420-421.

*Primary Examiner*—Jack I. Berman
*Assistant Examiner*—Kiet T. Nguyen
*Attorney, Agent, or Firm*—James W. Falk; Charles S. Guenzer

[57] ABSTRACT

A magnetic electron focusing lens including a first pole piece, from a back side of which low-energy electrons are injected, and a second pole piece located on a front side of the first pole piece. The first and second pole pieces are coupled to form a single magnetic circuit. The first pole piece is shaped to maximize the magnetic field at a its front side at a peak much closer to the first then to the second pole piece. The specimen is located between the first and second pole pieces near the peak of the magnetic field.

17 Claims, 5 Drawing Sheets

ELECTRON MICROSCOPE WITH AN ASYMMETRICAL IMMERSION LENS

FIELD OF THE INVENTION

The invention relates generally to electron beam instruments. In particular, the invention relates to an electron focusing lens usable with large area specimens.

BACKGROUND OF THE INVENTION

Electron beam instruments, such as electron microscopes, are commonly used in the research and development underlying modern integrated electronic circuits and even in the production lines for them. Over the past decade, the technology in processing semiconductor wafers has been pushed forward in achieving ever smaller features in commercial integrated circuits. Today, 1 $\mu$m line widths have become commonplace on a VLSI chip and 0.1 $\mu$m line widths are being researched. Needless to say, the resolution of electron beam instruments needs to keep pace with this reduced scale.

Scanning electron microscopes for electronic circuits are preferably operated in the range of 0.5 kV to 2 kV in order to minimize charging effects in the insulating parts of the circuits and also to prevent damage to the fabricated device being tested. To make a meaningful measurement on a line of a given width, a resolution is required of better than 1%, for example, a resolution of 2 nm for a line width of 0.2 $\mu$m, which is common in present day developmental research. Operation at 1 kV would be preferred. At the present time, the best commercially available electron microscopes suitable for semiconductor wafer measurements provide a resolution of 20 nm at 2 kV with a thermal emission gun and of about 10 nm with a field emission gun. Thus, the available resolution is unsatisfactory even at the upper end of the usable voltage range. For low voltage operation, the chromatic aberration in available scanning electron microscopes becomes the limiting factor in further reducing probe size because of the unavoidable energy spread of electron sources. The probe size is the focussed electron beam diameter which must be less than the required resolution.

Integrated circuits are almost always fabricated on a wafer. Wafers for research purposes may be as little as 2 inches (50 mm) in diameter for advanced materials such as GaAs. However, production line wafers, particularly for silicon, are significantly larger. Most present day production is performed on 4 and 5 inch (100 and 125 mm) wafers. Some production lines use 8 inch (200 mm) wafers. Wafers as large as 12 inches (300 mm) are forecast. It is preferred that the fabricated wafer not need to be diced in order to be inspected in an electron microscope. Needless to say, obtaining 2 nm resolution within a chamber accommodating a 300 mm specimen presents significant difficulty for an electron microscope. Because of the problem with wafer sizes, the commercially usable instruments are equipped with conventional non-immersion magnetic lenses. Examples of non-immersion lens are disclosed by Wolff in U.S. Pat. No. 3,560,739 and by Shiokawa in U.S. Pat. No. 4,639,597 and in Japanese Laid-open Application 62-229643 (1987). Electron microscope lens are generally cylindrically symmetric with a central bore passing the electrons having a diameter d. Surrounding this bore are one or more cylindrically symmetric magnetic poles. In a non-immersion lens, two axially adjacent magnetically coupled pole pieces establish a single magnetic circuit across a narrow gap between the poles in the vicinity of the bore. The resulting magnetic field is strongest in the gap and is used to focus the electron beam. Once the electrons leave the gap region, they are substantially free from further magnetic confinement.

An immersion lens offers markedly better resolution over non-immersion lens. In an immersion lens, the axial gap between two poles is widened sufficiently to allow the specimen to be placed within the gap. Thus the magnetic field sharply peaks adjacent the specimen. Pawley has recently disclosed in a technical article ("Low Voltage Scanning Electron microscopy" appearing in EMSA Bulletin, volume 18, number 1, 1988 at pages 61-64) a 4 nm probe diameter obtainable at 1 kV with such an immersion lens. However, conventional immersion lenses are designed to limit aberrations in such a way that the bores on both poles and the gap between them cannot be made very large. The resultant geometry makes it impossible to place a large semiconductor wafer into the lens gap. Specimen tilting becomes almost impossible with immersion lenses and there are difficulties of extracting signals for secondary or back-scattered electrons desired for certain types of imaging.

Yet another alternative is to use a single pole piece, such as described by Mulvey at pages 359-490 in a chapter entitled "Unconventional Design of Magnetic Lenses" appearing in the book *Magnetic Electron Lenses*, edited by P. W. Hawkes (Springer, Berlin, 1982). Other examples are disclosed by Reisner in U.S. Pat. No. 2,819,403 and by Smith in U.S. Pat. No. 2,418,432. In a single pole piece design, the specimen is placed between the electron gun and the lens, the magnetic field of which extends towards the gun through the specimen. Such a design allows large specimen size but other problems arise. For instance, in order to maintain good optics by reducing aberrations, the focal plane must be kept close to the pole face, usually tenths of a millimeter. Since the specimen is placed between the gun and the lens, the specimen thickness is limited and the specimen holder is limited. Specimen tilting becomes impossible. Such a design is thus impractical for a commercial instrument.

Bassett et al have disclosed in U.S. Pat. No. 3,707,628 a conical coil in a magnetic lens. In this lens, the electron beam enter the wide part of the conical coil and exit an axial aperture adjacent the specimen. Japanese Laid-open Application 60-258836 (1985) discloses that a conical coil of this sort is useful for tilting a specimen with respect to the electron beam. Nonetheless, these designs are still considered inadequate.

SUMMARY OF THE INVENTION

Accordingly, an object of the invention is to provide a high resolution electron microscope lens.

A further object of the invention is to provide an electron microscope lens which is compatible with large specimen sizes and tilting of specimens.

The invention can be summarized as an electron lens in which electrons are injected into the bore at the back of a first pole piece, preferably of conical shape. The specimen is placed close to the tip of the first pole piece and between it and a second pole piece. The second pole piece is magnetically coupled to the first pole piece but is much further away from the specimen than is the first pole piece. The effect is that the magnetic field is maximized at a peak at which the field rises sharply in the axial direction from the first pole piece and thereafter slowly falls toward the second pole piece. The specimen is placed near the peak where the electrons are focused.

DETAILED DESCRIPTION

The magnetic lens of the present invention uses one shaped pole piece, through which the electrons are injected by the electron source, and another pole piece whose shape and extent are relatively unimportant. The two pole pieces form a common magnetic circuit driven by a coil. The magnetic field sharply rises from the shaped pole piece to a peak near which the specimen is placed. The magnetic field thereafter falls off slowly toward the unshaped pole piece. The specimen is placed near the shaped pole piece. Thus only the rising part of the field curve will have an effect on the electrons. The broadened falling part will have no substantial effect on the primary beam.

Figure 1:
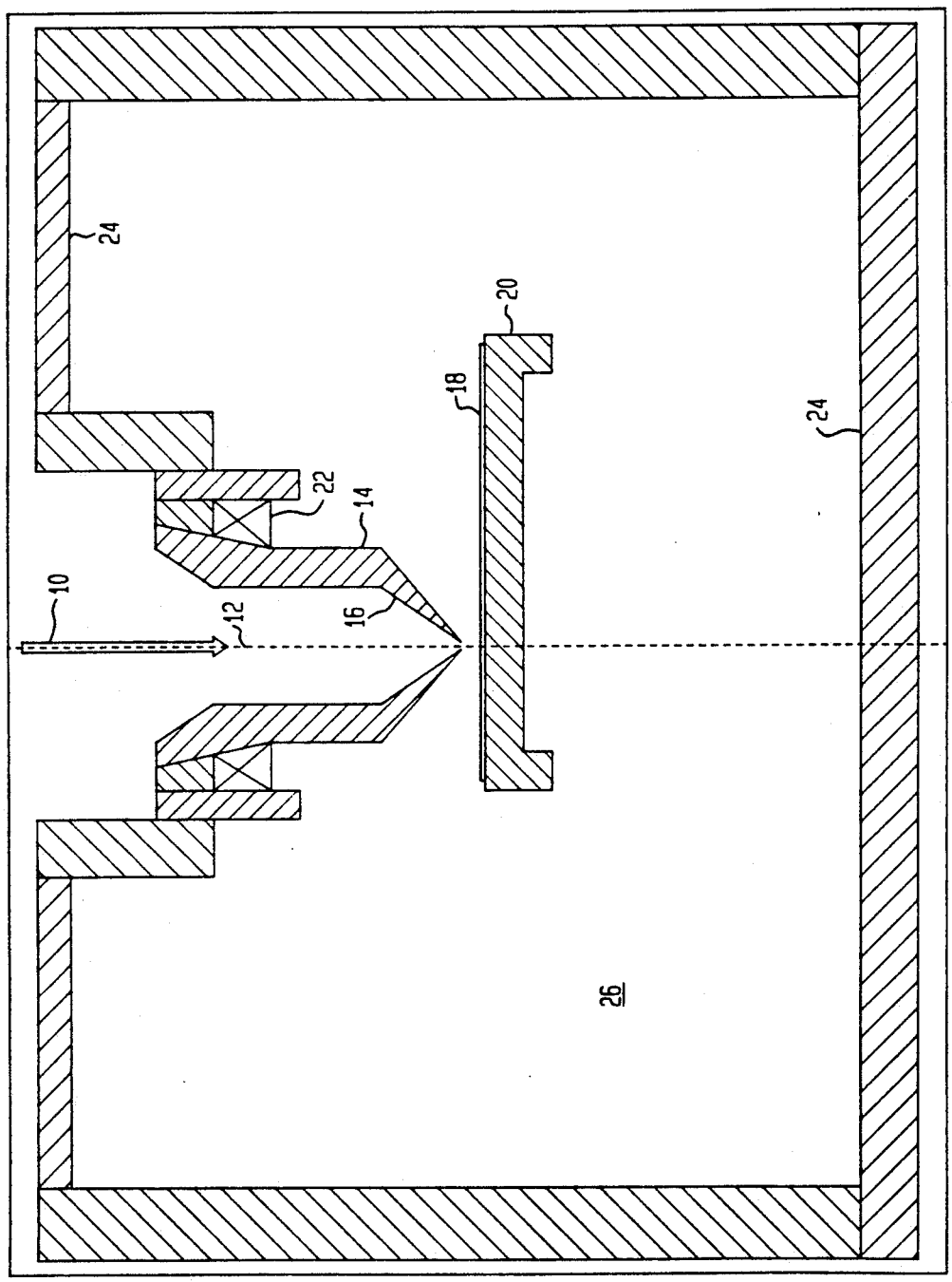
FIG. 1 is cross-sectional view of an embodiment of the magnetic lens of the present invention.

A cross-section of the magnetic lens is illustrated in FIG. 1. An electron beam 10, injected along an optical axis 12 by an as yet unillustrated electron gun, enters the rear of a conical pole piece 14 having a central bore 16 and exits through a front tip of the conical pole piece 14. A specimen 18 is placed on a movable non-magnetic holder 20 so as to be positioned a few millimeters from the tip of the conical pole piece 14. The conical pole piece 14 is excited by a cylindrical coil 22 and is magnetically connected to a magnetic housing 24 which surrounds the remainder of the specimen chamber 26. Both the conical pole piece 14 and the magnetic housing 24 are conductive and held at ground potential. The magnetic housing 24 acts as a second pole piece driven by the same coil 22 as the conical pole piece 14. It provides a return path for the magnetic field concentrated adjacent the bore 16 in the vicinity of the specimen 18.

A somewhat similar design was disclosed by one of the inventors, Shao, in a technical article entitled "New lens for a low-voltage scanning electron microscope" appearing in Review of Scientific Instrumentation volume 59, 1988 at pages 1985–1989. Shao's design differs from the present one as being a single pole piece design, that is, the electron beam traverses the specimen before entering the front of the conical pole piece. However, Shao characterized the second pole piece as being a "half-pole" piece modifying the field of the conical pole piece. In a single pole lens, the axial field is entirely determined by the size and the shape of the pole piece. As a result, the pole diameter must be kept very small in order to provide good optical properties and the bore is kept even smaller or ideally zero. However, in the present invention, the size of the bore should be made large (relative to the tip size) in order to push out the maximum field. A very small bore is not acceptable, both in view of optical performance and in view of practical applications. The shape of the tip is not as important as the bore but a conical shape has two advantages: (1) it allows the specimen to be tilted at large angles, (2) the small tip can produce stronger magnetic field at relatively low coil excitation. Thus, the semi-angle $\theta$ of the tip piece may assume usable values over a wide range. In other words, the present invention uses a technique similar to that used in a conventional immersion lens but moves the lower pole piece to a very great distance so that its geometry is no longer particularly important to the useful portion of the axial field and further allows a separate design of the upper pole shape to suit the application.

Figure 2:
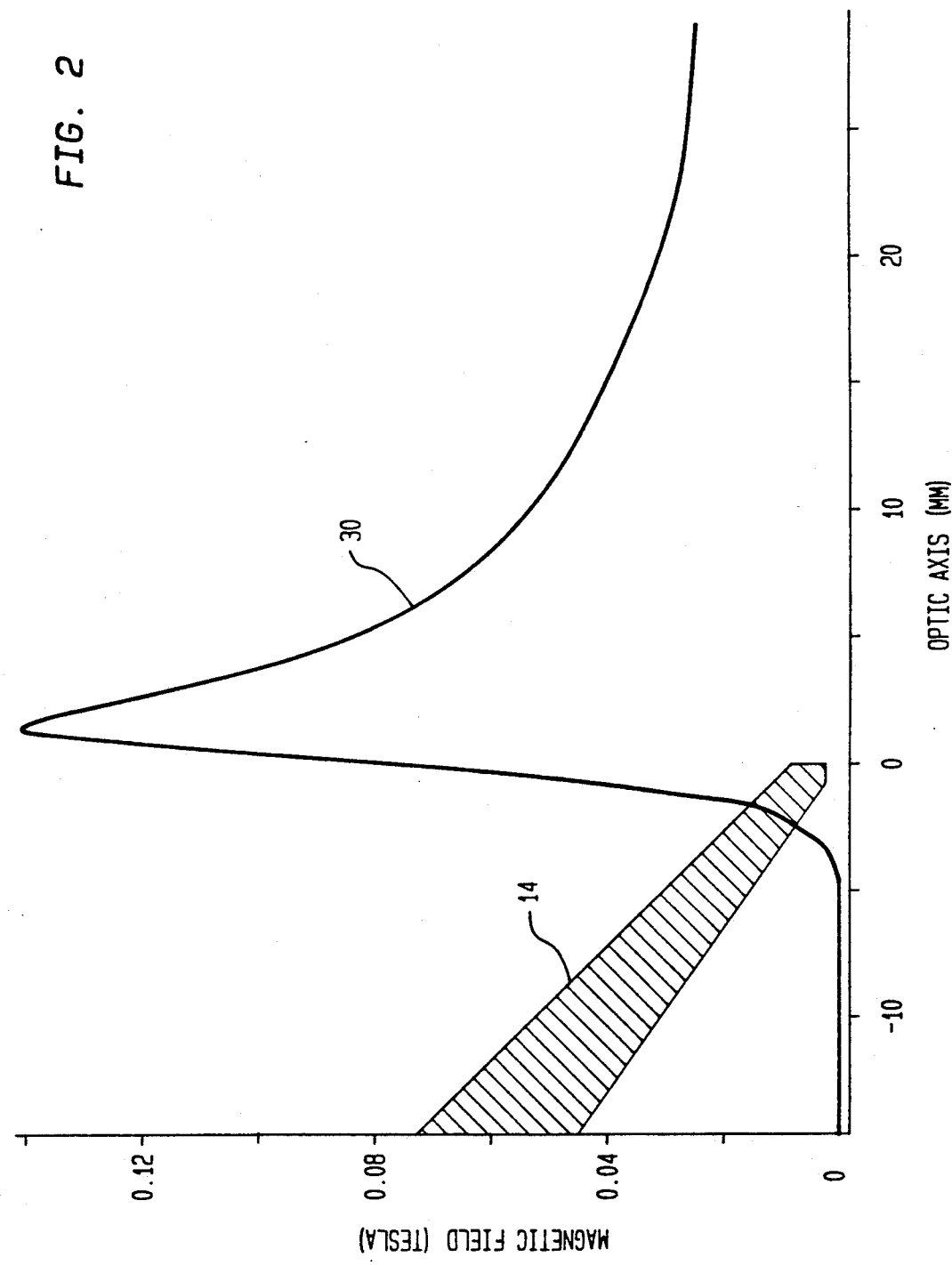
FIG. 2 is graph of the magnetic field strength along the optical axis, upon which is superimposed a cross-section of the conical pole piece.

The magnetic field produced by such an arrangement is graphed by a curve 30 of FIG. 2 for a particular set of parameters to be described later. This figure also shows the location of the conical pole piece 14 along the optical axis 12. This curve shows that the magnetic field is generally small within the conical back bore of the conical pole piece 14 but rises sharply to a peak just in front of the conical pole piece 14. The specimen 18 is positioned at the peak or on the gradually falling portion of the curve 30. After the peak, the magnetic field falls slowly toward the second pole piece represented by the magnetic housing 24. Thus, it is seen that once the electrons have been focused on the specimen 18, the magnetic field has no effect on the primary beam electrons.

If the lens of FIG. 1 is to be used to house a 12-inch wafer as the specimen 18, the magnetic housing 24 should have a diameter of at least 24 inches (600 mm). For most electron lenses, the poles must be precision machined, clearly impractical for a 600 mm housing. However, in the design of FIG. 1, the focal plane is a few millimeters from the conical pole piece 14 and at least 200 mm from the magnetic housing 24, that is, the second pole piece. That is, the ratio of the separation of the area being sampled from the closest part of the second pole piece to the separation from the tip of the conical first pole piece is more then 10 and preferably more than 50. Therefore, the magnetic field guiding the electron is determined almost entirely by the conical pole piece 14 and the shape of the second pole piece is of secondary importance. Although it is illustrated as a generally planar pole piece in the preferred embodiment, other shapes such as conical shapes, are possible as long as the specimen is substantially closer to the tip of the conical pole piece 14 than to any part of the second pole piece. It has been estimated that complete removal of the bottom shielding would change the optical properties of the lens by less than 5%. Thus, no precision machining of the magnetic housing 24 is required and its general shape is not particularly constrained. Small asymmetries in the magnetic fields can be corrected by a stigmator in most cases.

Figure 3:
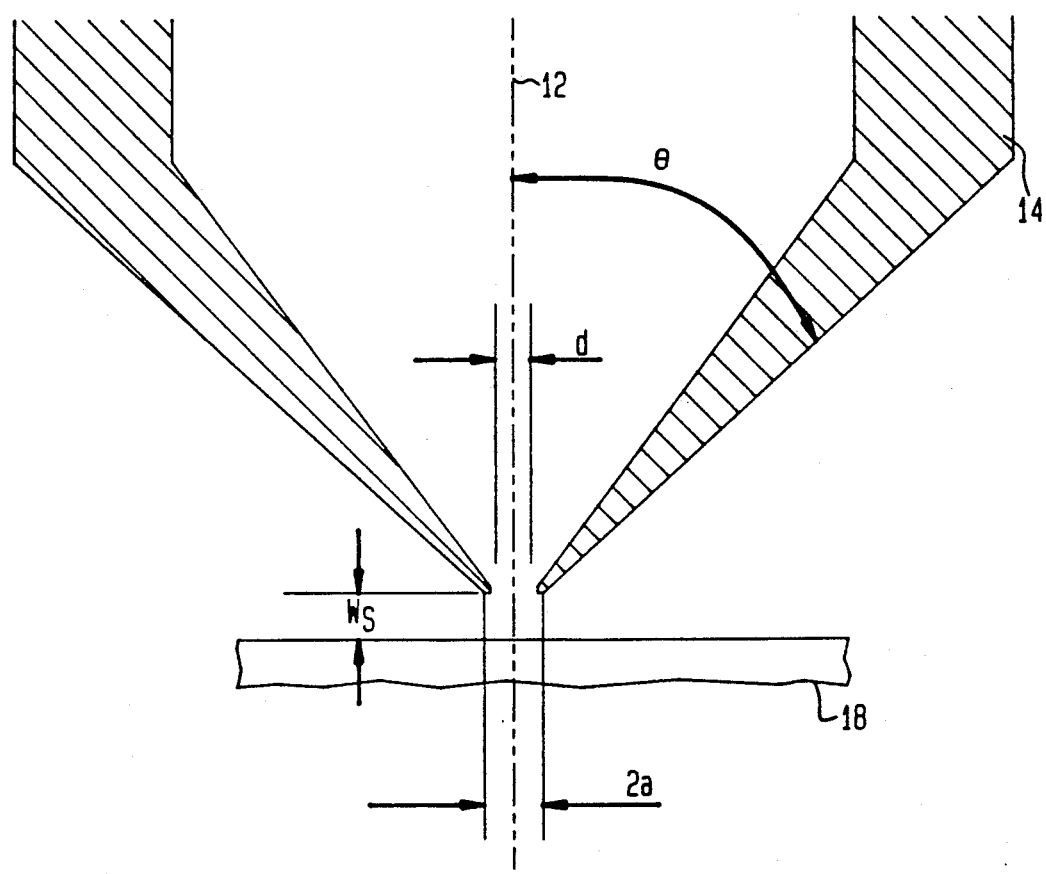
FIG. 3 shows in more detail a portion of the cross-section of FIG. 1.

A more detailed cross-section of one embodiment of the conical pole piece of the invention is illustrated in FIG. 3. An outside conical angle of $\theta$ of 45° was chosen in order to allow substantial tilting of the specimen 18. The conical pole piece 14 has a bore diameter d. The front tip of the conical pole piece has a flat surface of finite width facing the specimen 18 characterized by a pole tip diameter $2a$. The pole tip is separated from the specimen 18 by a distance (working space) $W_s$, at which point the electron beam is focused to a probe radius $\delta$. The probe radius $\delta$ is determined from the chromatic and spherical aberrations $C_c$ and $C_s$, calculable from the magnetic field distribution, and from the primary beam energy V and the electron source energy spread δV.

Figure 4:
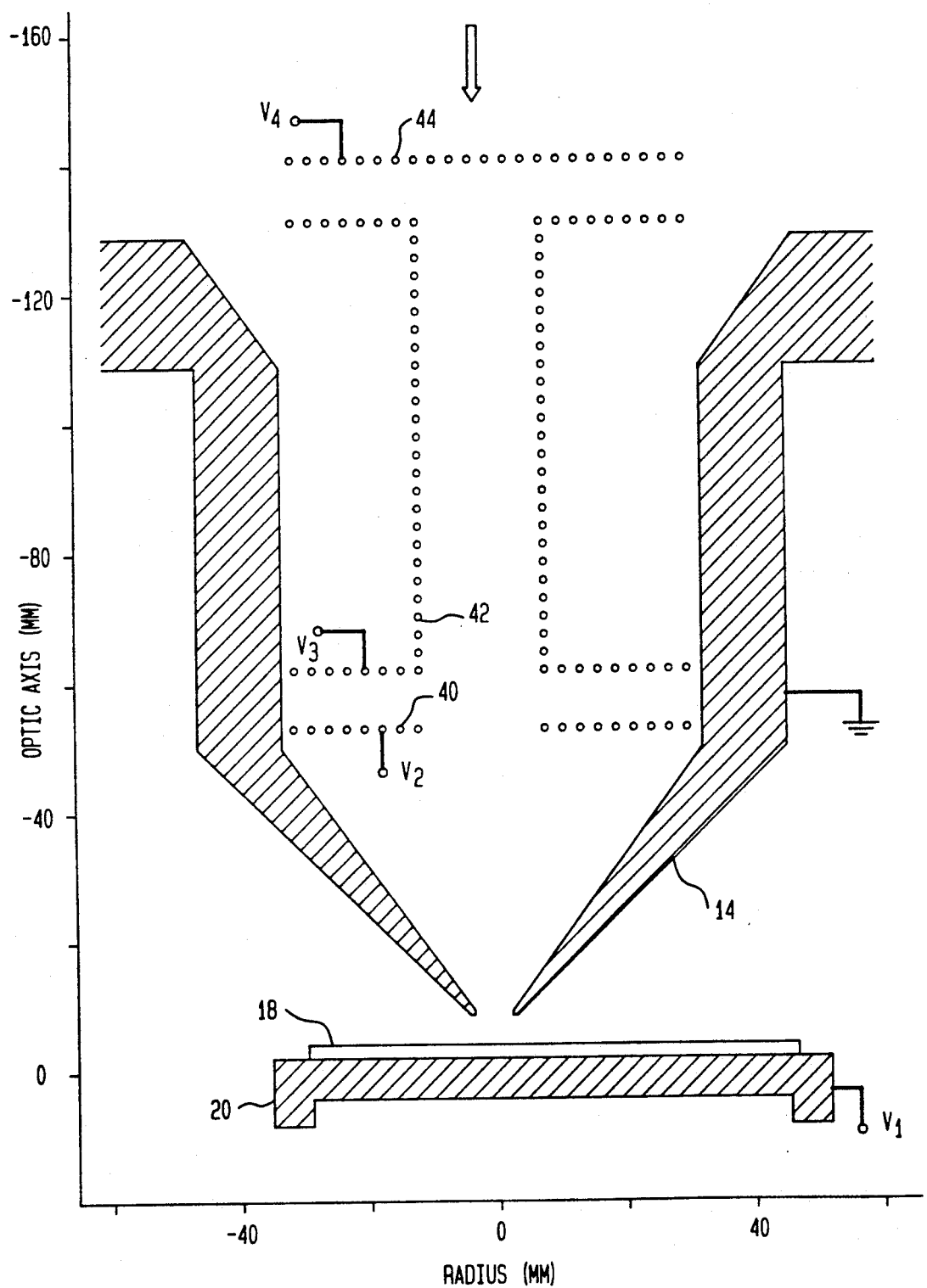
FIG. 4 is a cross-section of the conical pole piece and biased grids used for secondary electron detection.

A computer program was developed to calculate the magnetic fields produced by the lens of FIG. 1 for different values of d, a and $W_s$. From the magnetic field, the optical properties were derived. The results of four calculations are shown in TABLE 1. Other pertinent parameters used in the calculations were as follows. The gaussian energy spread δV was 0.15 V. The conical pole piece and the magnetic housing were composed of soft iron. The conical pole piece had an outside conical half angle θ of 45° and an inside conical half angle of 35° so as to confine the magnetic field within the soft iron and focus it at its tip. The magnetic housing 24 had a diameter of 600 mm and a height of about 450 mm with the tip of the conical pole piece 14 being approximately in the middle. FIGS. 1 and 4 are approximately to scale and relevant dimensions may be taken therefrom. The magnetic lens was excited with 2070 amp-turns for the larger working space $W_s$ and with 2145 amp-turns for the smaller working space.

TABLE 1

| Lens Parameters<br>V = 1 kV | $W_s$<br>(mm) | $f_o$<br>(mm) | $C_s$<br>(mm) | $C_c$<br>(mm) | δ<br>(nm) |
|---|---|---|---|---|---|
| d = 2 mm 2a = 4 mm | 2 | 1.4 | 1.3 | 1.0 | 1.7 |
| θ = 45° | 1.0 | 0.8 | 0.4 | 0.5 | 1.2 |
| d = 3 mm 2a = 5 mm | 2.5 | 1.8 | 1.5 | 1.3 | 2.0 |
| θ = 45° | 1.0 | 1.0 | 0.5 | 0.7 | 1.4 |

In TABLE 1, the probe radius δ was calculated from the approximate formula $$\delta = 0.25 \cdot \left[ \frac{C_c \cdot \delta V}{V^{3/2}} \right]^{1/2}$$

where δ is in units of nanometers and δV in eV. This formula is valid for the very low beam voltages V used here. The large values of $W_s$ correspond to a design in which tilting of the specimen is allowed. Even in these cases, probe radii δ of 2 nm and less are possible. If the specimen is brought to within 1.0 mm of the tip of the conical probe piece, at which distance specimen tilting becomes difficult, the probe radius δ is reduced further to about 1.2 nm.

Even smaller probe sizes can be obtained if the excitation current is increased to the point where saturation of the soft iron becomes apparent. At a working space $W_s$=1.0 mm and an excitation current of 4100 amp-turns, the smaller conical pole piece shows $f_o$=0.8 mm, $C_s$=0.4 mm, and $C_c$=0.5 mm. At the same working space and an excitation current of 4400 amp-turns, the larger pole piece shows $f_o$=0.99 mm, $C_s$=0.5 mm, and $C_c$=0.7 mm.

The extraction of secondary electrons for the microscope lens of the present invention presents potential problems since the secondary electrons can only be detected through the lens. In the present design, the lens bore is relatively small (~2 mm). Without specific guiding of the secondary electrons, an unacceptably high fraction would be absorbed by the conical pole piece. However, for the relatively low electron voltages envisioned for the invention, applying an axial magnetic field (so-called parallel extraction) would inevitably produce a stray field deleteriously affecting the low energy electrons. Furthermore, since the secondary electrons may be emitted from a point beyond the magnetic field peak, e.g. for 45° tilting, low energy secondary electrons may not be able to surmount the magnetic field maximum.

Therefore, in order to increase the efficiency of secondary electron detection, it is preferable to impose a weak electrostatic field between the specimen 18 and the conical pole piece 14 by applying a negative potential $V_1$ to the specimen holder 20, as illustrated in the schematic of FIG. 4. This extraction field will preaccelerate the secondary electrons and enable them to overcome the magnetic barrier existing between their point of emission and the bore of the lens. The strength of the extraction field should be chosen so that it is sufficient for the detection of secondary electrons but is weak enough to not affect the primary electrons. Our numerical simulations have shown that a specimen potential of $V_1 = -200$ V provides an acceptable extraction field for the disclosed parameters. It may, of course, vary for substantially different parameters.

When secondary electrons spiral out of the bore of the conical pole piece 14, a micro-channel plate may be used to obtain imaging signals. However, a more conventional system based on conducting grids and photomultiplier tubes will be described hereunder.

In order to not increase the chromatic aberration $C_c$, which is critical at the low primary voltages V, a cylindrically symmetric detection system should be used. As illustrated in FIG. 4, an auxiliary grid 40 held at a potential $V_2$ provides a little more acceleration to keep secondary electrons away from the inner surface of the conical pole piece 14. An extraction grid 42 is held at a potential $V_3$ lower than the potential $V_2$ of the extraction grid 40 in order to reduce the axial velocity of the secondary electrons. A restrain grid 44 is held at a negative potential $V_4$ in order to turn back any uncollected secondary electrons to be collected by nearby portions of the grounded conical pole piece 14. For properly chosen grid potentials, most secondary electrons are collected at least on their way back from the restrain grid 44. Additionally, all the grid potentials should be kept as low as possible in order to minimize their effects on the primary beam electrons. Of course, the grid material should be non-magnetic so as to act solely as an electrostatic lens. We have found that for a 1 kV primary beam energy of V=1 kV, suitable grid potentials are $V_1 = -200$ V, $V_2 = +100$ V, $V_3 = -100$ V, and $V_4 = -250$ V.

To confirm the design for secondary electron extraction, a series of calculations were performed, using fourth order Runge-Kutta equations, for the secondary electron orbits in the combined electrostatic and magnetic fields. The general conclusions based on these calculations is that a sufficient number of secondary electrons are collected to provide a good detection signal.

An advantage of the above design is that energy analysis of secondary electrons can be performed by placing another variable voltage grid between the extraction grid 42 and the specimen 18 or behind the extraction grid 42.

For detection of back scattered electrons, the extraction grid 42 should be turned off, $V_3 = 0$ V, and a scintillator-PMT combination is then placed in back of the restrain grid 44. For geometries we investigated, the field of view is slightly larger than ±200 μm if coma is corrected by the use of off-axis scanning described by Crewe et al in a technical article appearing in Optik, volume 46, 1976 at pages 183 et seq.

Figure 5:
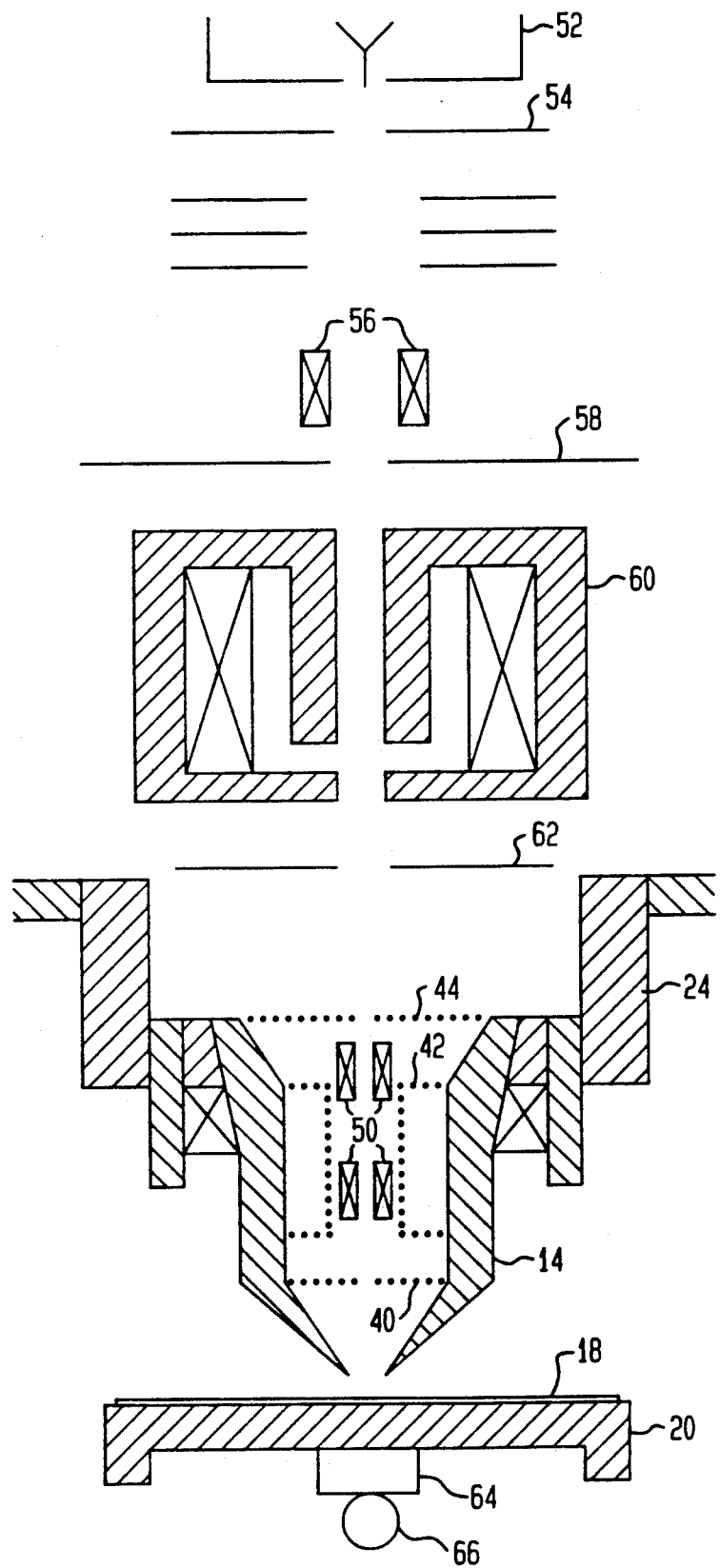
FIG. 5 is a schematic diagram of a complete electron microscope with which the magnetic lens of this invention is usable.

A partial cross-section of a low voltage scanning electron microscope is shown in FIG. 5. The vacuum enclosure is not shown and only part of the magnetic housing 24 is shown. The specimen holder 20 can translate the specimen in three orthogonal directions as well as tilt the specimen 18 up to the limit imposed by the conical pole piece 14. The detection grids 40, 42 and 44 are placed within the back bore of the conical pole piece 14, along with scanning coils 50 for scanning the primary electron beam over the specimen 18. The electrons are emitted from a cold field emission source 52 and accelerated by an extraction electrode 54. Minor aberrations are corrected by double scanning stigmator coils 56. A differential aperture 58 acts to retain a high vacuum near the electron source 52. A coil within a yoke constitutes a condenser lens 60. The beam is finally defined by a final aperture 62. The specimen holder 20 is supported by an x-y-z translator 64 so as to allow both specimen placement near the tip of the conical pole piece 14 and to scan different areas of the specimen 18. The translator 64 in turn is supported on an axis 66 so that the specimen 18 can be tilted with respect to the electron beam. These preceding elements are all well known in the field of electron microscopes, are commercially available and will not be further discussed.

The lens design presented above is particularly useful for low voltage electron beam instruments because of its extremely low aberration coefficients. Combined with a rotationally symmetric secondary electron extraction system, it can be used in a low voltage scanning electron microscope accommodating very large specimens. Because of the geometrical relationship between the electron gun, lens and specimen, there is no limit on the specimen size and thickness and, further, the specimen holder can be made relatively complex without interfering with the primary electrons. When the first pole piece is made conical, the specimen can be tilted.

The conical design of the first pole piece is consistent with low voltage operation but prevents its use with very high voltage operation, viz., above 15–20 keV.

What is claimed is:

1. A charged-particle focusing apparatus including a magnetic lens and a specimen holder,
   wherein said magnetic lens comprises:
   a substantially cylindrically symmetric first pole piece having a central aperture for passage of charged particles in a first direction from a back side to a front side thereof along an optic axis;
   a second pole piece magnetically coupled to said first pole piece to form a magnetic circuit, a substantial magnetic portion of said second pole piece extending through a region defined on an external side facing opposite said first direction and toward said first pole piece by a plane that is perpendicular to said optic axis and that touches said front side of said first pole piece; and
   a coil to drive said magnetic circuit to produce a magnetic field distribution, said distribution having a maximum value at a peak position near said front side of said first pole piece; and
   wherein said specimen holder is for holding a specimen at a specimen position away from said first pole piece along said optic axis substantially closer to said front side of said first pole piece than to any magnetic portion of said second pole piece, said charged particles being focused by at least said first pole piece adjacent said specimen position.

2. A charged-particle focusing apparatus as defined in claim 1, wherein said specimen position is a position on a side of said peak position away from said front face of said first pole piece.

3. A charged-particle focusing apparatus as defined in claim 1, wherein said first pole piece has an exterior conical shape tapering outward from said front side to said back side.

4. A charged-particle focusing apparatus as defined in claim 3, wherein said specimen holder includes means for tilting said specimen relative to said optical axis so that a portion of said specimen is on a side of said plane toward said back side of said first pole piece.

5. A charged-particle focusing apparatus as defined in claim 3, wherein said specimen position is closer to said front side of said first pole piece than to any portion of said second pole piece by a factor of at least 10.

6. A charged-particle focusing apparatus as defined in claim 5, wherein said factor is at least 50.

7. A charged-particle focusing apparatus as defined in claim 1, further comprising a charged particle source positioned along said optic axis facing said back side of said first pole piece.

8. A charged-particle focusing apparatus as defined in claim 7, wherein said first pole piece has an exterior conical shape tapering outward from said front side to said back side and an interior bore facing said back side of said first pole piece and further comprising substantially cylindrically symmetric electrical coils disposed in said bore for steering charged particles emanating from said specimen.

9. A charged-particle focusing apparatus as defined in claim 1, wherein said specimen holder is partially disposed within said region.

10. A focusing charged-particle beam system, comprising:
    a first pole piece having a central aperture extending along and being substantially cylindrically symmetric about a central axis;
    means for injecting charged particles through said central aperture in a first direction from a back side to a front side of said first pole piece;
    a second pole piece magnetically coupled to said first pole piece and having a magnetic part extending through a front region defined on an external side facing opposite said first direction and toward said first pole piece by a plane that is perpendicular to said central axis at a tip point at which said central axis intersects said front side of said first pole piece, all magnetic parts of said second pole piece within said front region being no closer to said tip point than a specified distance;
    driving means to drive said magnetic circuit to produce a magnetic field distribution that has a maximum value along said central axis at a peak point that is substantially closer to said tip point than said specified distance; and
    a specimen holder for holding and positioning a specimen at any point within a region including said peak point.

11. A focusing charged-particle beam system as recited in claim 10, wherein said first pole piece has an outer conical shape tapering inward toward said tip point.

12. A focusing charged-particle beam system as recited in claim 11, wherein said second pole piece comprises a cylindrical magnetic section extending parallel to said central axis through said front region for a distance substantially larger than a separation between said peak point and said tip point.

13. A focusing charged-particle beam system as recited in claim 10, wherein said specimen holder can tilt said specimen relative to said plane.

14. A focusing charged-particle beam system as recited in claim 10, wherein said charged particles are electrons and further comprising:
   means for negatively biasing said specimen holder with respect to said first pole piece; and
   electron detecting means at least partially disposed within said central aperture of said first pole piece.

15. A focusing charged-particle beam system as recited in claim 14, wherein said electron detecting means includes:
   an auxiliary grid disposed within said central aperture and held at a positive voltage with respect to said first pole piece; and
   an extraction grid disposed on said back side of said first pole piece with respect to said auxiliary grid and held at a negative voltage with respect to said auxiliary grid.

16. A focusing charged-particle beam system as recited in claim 10, wherein said specimen holder is partially disposed within said front region.

17. A focusing charged-particle beam system, comprising:
   a first pole piece having a central aperture extending along a first axis extending in a first direction from a back side to a front side thereof;
   means for injecting charged particles through said aperture along said first direction from said back side of said first pole piece;
   a second pole piece magnetically coupled to said first pole piece and extending adjacent said first axis at a first point facing said front side of said first pole piece;
   current means for inducing a magnetic field in said first and second pole pieces; and
   a specimen holder for holding a specimen on said first axis at a second point disposed substantially closer to said front side of said first pole piece than to said first point, no magnetic portion of said second pole piece intercepting said first axis between said first and second points.

* * * * *